United States Patent [19]
Uchida et al.

[11] Patent Number: 5,266,103
[45] Date of Patent: Nov. 30, 1993

[54] BATH AND METHOD FOR THE ELECTROLESS PLATING OF TIN AND TIN-LEAD ALLOY

[75] Inventors: Hiroki Uchida; Motonobu Kubo; Masayuki Kiso; Teruyuki Hotta; Tohru Kamitamari, all of Hirakata, Japan

[73] Assignee: C. Uyemura & Co., Ltd., Osaka, Japan

[21] Appl. No.: 907,038

[22] Filed: Jul. 1, 1992

[30] Foreign Application Priority Data

Jul. 4, 1991 [JP] Japan ............... 3-190768
Aug. 9, 1991 [JP] Japan ............... 3-224944

[51] Int. Cl.$^5$ ............................... C23C 18/52
[52] U.S. Cl. ............................ 106/122; 106/1.25
[58] Field of Search ..................... 106/1.22, 1.25

[56] References Cited

U.S. PATENT DOCUMENTS

| | | | |
|---|---|---|---|
| 4,093,466 | 6/1978 | Davis | 427/437 |
| 4,194,913 | 3/1980 | Davis | 106/1.22 |
| 4,234,631 | 11/1980 | Davis | 427/436 |
| 4,550,037 | 10/1985 | Kinkelaar et al. | 427/443.1 |
| 4,816,070 | 3/1989 | Holtzman et al. | 106/1.22 |
| 4,997,686 | 3/1991 | Feldstein et al. | 427/443.1 |
| 5,143,544 | 9/1992 | Iantosca | 427/443.1 |
| 5,145,517 | 9/1992 | Feldstein et al. | 106/1.27 |
| 5,147,454 | 9/1992 | Nishihara et al. | 106/1.22 |

FOREIGN PATENT DOCUMENTS

1-184279 7/1989 Japan.

OTHER PUBLICATIONS

English translation of Abstract of Japanese Patent Apln. Kokai 1-184279 1989.

*Primary Examiner*—Helene Klemanski
*Attorney, Agent, or Firm*—Birch, Stewart, Kolasch & Birch

[57] ABSTRACT

A tin or tin-lead alloy electroless plating bath comprising (A) a stannous salt or a mixture of a stannous salt and a lead salt, (B) an acid, (C) thiourea or a thiourea derivative, and (D) a reducing agent is improved by adding (E) a nonionic surfactant and optionally, (F) a cationic surfactant, a nitrogenous heterocyclic compound or a derivative thereof, or alternatively by adding (G) an ammonium or quaternary ammonium ion. From the bath, uniform films of fine grains will chemically deposit on fine pitch printed wiring boards intended for SMT.

12 Claims, No Drawings

BATH AND METHOD FOR THE ELECTROLESS PLATING OF TIN AND TIN-LEAD ALLOY

This invention relates to a bath and method for the electroless plating of tin or tin-lead alloy, and more particularly, a tin or tin-lead alloy electroless plating bath of the acidic type adapted to form a tin or tin-lead alloy layer on copper circuits of electronic parts as well as a method therefor.

BACKGROUND OF THE INVENTION

Heretofore, electroless plating of tin or tin-lead alloy has been practiced for the purpose of improving solidability of copper or copper alloy conductors that form circuits on electronic parts such as printed wiring boards. In order to meet the general demand on electronic equipment for size reduction, parts and circuits are reduced in size or increased in complexity, leaving some areas which are restrained from plating by electrodeposition techniques. Particular attention is paid to tin or tin-lead alloy electroless plating techniques which can provide plating on such restricted areas. For example, Japanese Patent Application Kokai No. 184279/1989 discloses a tin or tin-lead alloy electroless plating bath mainly containing an organic sulfonic acid, tin and lead salts of an organic sulfonic acid, sodium hypophosphite as a reducing agent, and thiourea as a chelating agent.

On the other hand, the electronic part packaging technology such as for IC packages is now shifting from the vertical mount technique (VMT) of DIP type packages to the surface mount technique (SMT) of flat packages. Accordingly, printed wiring boards are required to have a smooth surface which is to come in contact with products to be packaged such as IC packages, that is, to have a tin or tin-lead alloy coating of high uniformity deposited thereon.

However, prior art tin or tin-lead alloy electroless plating baths form deposits which consist of coarse grains and are less uniform and therefore, poor in reflow and solder-availability. It is thus difficult for such baths to plate fine pitch printed wiring boards intended for SMT.

SUMMARY OF THE INVENTION

An object of the present invention is to provide a tin or tin-lead alloy electroless plating bath of the acidic type which can form uniform deposits consisting of fine grains and is thus adapted for the plating of fine pitch printed wiring boards intended for SMT. Another object is to provide a electroless plating method using the bath.

In search of the composition of a tin-lead alloy electroless plating bath which can form uniform deposits consisting of fine grains, we have found that a tin or tin-lead alloy electroless plating bath containing a soluble metal salt component in the form of a stannous salt or a mixture of a stannous salt and a lead salt, an acid, thiourea or a thiourea derivative, and a reducing agent can be improved by (1) adding one or more nonionic surfactants thereto, preferably in combination with one or more members selected from a cationic surfactant, a heterocyclic compound having a nitrogen atom in the ring and a derivative thereof or by (2) adding an ammonium ion and/or quaternary ammonium ion thereto, whereby the bath forms uniform deposits consisting of fine grains and exhibiting improved reflow and is thus adapted for the plating of fine pitch printed wiring boards intended for SMT.

According to a first aspect of the present invention, there is provided a tin or tin-lead alloy electroless plating bath comprising (A) a soluble metal salt component selected from a stannous salt and a mixture of a stannous salt and a lead salt, (B) an acid, (C) thiourea or a thiourea derivative, (D) a reducing agent, and (E) a nonionic surfactant. The bath may further contain (F) a cationic surfactant, a heterocyclic compound having a nitrogen atom in the ring or a derivative thereof.

According to a second aspect of the present invention, there is provided a tin or tin-lead alloy electroless plating bath comprising (A) a soluble metal salt component selected from a stannous salt and a mixture of a stannous salt and a lead salt, (B) an acid, (C) thiourea or a thiourea derivative, (D) a reducing agent, and (G) an ammonium ion and/or a quaternary ammonium ion.

In either aspect, electroless plating of tin or a tin-lead alloy is carried out by immersing an article to be plated in the electroless plating bath, and maintaining the article under sufficient conditions to form a tin or tin-lead alloy film on the article.

DETAILED DESCRIPTION OF THE INVENTION

The tin or tin-lead alloy electroless plating bath contains (A) a stannous salt or a mixture of a stannous salt and a lead salt as a soluble metal component. The tin source for supplying a stannous ion or divalent tin ion to the plating bath may be selected from various compounds, for example, tin organic sulfonates such as stannous methanesulfonate, stannous borofluoride, tin acetate, tin chloride, tin organic carboxylates, and tin oxide. Preferably the bath contains about 1 to 50 gram/liter, more preferably about 5 to 25 gram/liter of stannous ion.

In the case of a tin-lead alloy plating bath, the lead ion source may be selected from various salts similar to those described for the tin ion source for example, lead chloride, lead acetate, lead organic sulfonates, lead borofluoride, and lead oxide. Preferably the bath contains about 0.1 to 50 gram/liter, more preferably about 0.5 to 10 gram/liter of lead ion although the lead concentration depends on the desired alloy composition.

The acid component (B) for dissolving the metal salts includes organic sulfonic acids, perchloric acid, fluoroboric acid, phosphoric acid, pyrophosphoric acid, condensed phosphoric acids such as polyphosphoric acid, hydrochloric acid, hypophosphorous acid, and organic carboxylic acids, alone and in admixture of two or more. Examples of the organic sulfonic acid include alkane sulfonic acids, hydroxyalkane sulfonic acids, benzenesulfonic acid, naphthalenesulfonic acid, and substituted acids thereof in which some hydrogen atoms are replaced by hydroxyl groups, halogen atoms, alkyl groups, carboxyl groups, nitro groups, mercapto groups, amino groups, sulfonate groups or the like. Preferred examples of the organic sulfonic acid used herein include methane-sulfonic acid, ethanesulfonic acid, propane-sulfonic acid, 2-propanesulfonic acid, butanesulfonic acid, 2-butanesulfonic acid, pentanesulfonic acid, chloropropanesulfonic acid, 2-hydroxyethane-1-sulfonic acid, 2-hydroxypropane-1-sulfonic acid, 2-hydroxybutane-1-sulfonic acid, 2-hydroxypentanesulfonic acid, allylsulfonic acid, 2-sulfoacetic acid, 2 -or 3-sulfopropionic acid, sulfosuccinic acid, sulfomaleic acid, sulfofumaric acid, benzenesulfonic acid, toluenesulfonic acid, xylenesulfonic acid, nitrobenzenesulfonic acid, sulfobenzoic acid, sulfosalicylic acid, benzaldehydesulfonic acid, p-phenolsulfonic acid, etc. The amount of the acid used in the bath is not particularly limited although it preferably ranges from about 10 to 200 gram/liter, more preferably from about 50 to 150 gram/liter. The weight ratio of acid to metal ion preferably ranges from about 1:1 to about 1:20, more preferably from about 1:3 to about 1:10.

The plating bath contains (C) thiourea or thiourea derivatives (thioamides) such as thioformamide and thioacetamide. The presence of the thiourea allows tin or tin-lead alloy to deposit. The amount of the thiourea used in the bath is not particularly limited although it preferably ranges from about 10 to 200 gram/liter, more preferably from about 50 to 150 gram/liter. In combination with the thiourea, a chelating agent may be used, for example, tartaric acid, malic acid, citric acid, and EDTA, in a concentration of 0 to about 200 gram/liter, more preferably about 10 to 100 gram/liter of the bath.

The reducing agent (D) is also contained in the plating bath of the present invention. The reducing agents include hypophosphorous acid and hypophosphites such as sodium hypophosphite and potassium hypophosphite. The reducing agent may be used in an amount of about 10 to 200 gram/liter, more preferably about 50 to 150 gram/liter of the bath.

The tin or tin-lead alloy plating bath containing components (A) to (D) is adjusted until acidic, preferably to pH 2 or lower. For this purpose, a pH adjusting agent may be used, for example, HCl, hypophosphorous acid, organic sulfonic acids, fluoroboric acid, phosphoric acid, pyrophosphoric acid, and etc.

The plating bath according to the first aspect is obtained by adding (E) one or more nonionic surface active agents to the plating bath having the above-mentioned components (A) to (D) mixed in a suitable proportion. The addition of the nonionic surfactant is effective for making deposits uniform. Examples of the nonionic surfactant include polyoxyalkylether series surfactants such as polyoxynonylphenyl ether, polyoxylaurylphenyl ether, etc., polyoxyalkylamide ether series surfactants such as polyoxystearylamide ether, polyoxyalkylamine ether series surfactants such as polyoxyoleylamine ether, in all these compounds, the alkyl moiety has 1 to 20 carbon atoms), and polyoxyethylene-propylene block polymer surfactants (3-100 mol ethylene oxide/1-100 mol propylene oxide). The amount of the nonionic surfactant used in the bath is not particularly limited although it preferably ranges from about 0.01 to 50 gram/liter, more preferably from about 1 to 10 gram/liter.

In the plating bath of the invention, an additive (F) selected from the group consisting of a cationic surfactant, a heterocyclic compound having a nitrogen atom in the ring, a derivative thereof, and mixtures thereof is preferably used in combination with nonionic surfactant (E). Examples of the cationic surfactant include alkylamine salts, alkyltrimethylamine salts, alkyldimethylbenzylamine salts, etc., with stearylamine hydrochloric acid salt and alkylpropylenediamine acetic acid salts being preferred. Examples of the heterocyclic compound having a nitrogen atom in the ring include alkylpyridines, alkylimidazoles, alkylquinolines, and alkylpurines, with 2-oxypyridine and 2-oxyimidazole being preferred. In all these compounds, the alkyl moiety has 1 to 20 carbon atoms.

As additive (F), the cationic surfactants and heterocyclic compounds may be used as a mixture of two or more although they may be used singly with satisfactory results. The amount of the additive (F) used in the bath is not particularly limited although it preferably ranges from about 0.01 to 50 gram/liter, more preferably from about 1 to 10 gram/liter.

The plating bath according to the second aspect is obtained by adding (G) an ammonium ion and/or a quaternary ammonium ion to the plating bath having the above-mentioned components (A) to (D) mixed in a suitable proportion. The presence of ammonium ion and quaternary ammonium ion is effective for adjusting the pH of the bath and increasing the solubility of the metal salt or salts, thereby improving the uniformity of a deposit resulting from the bath.

The amount of ammonium ion and quaternary ammonium ion (G) used in the bath is not particularly limited although it preferably ranges from about 0.1 to 50 gram/liter, more preferably from about 1 to 20 gram/liter. An ammonium content of less than 0.1 g/l would sometimes fail to form uniform deposits having good reflow property. The ammonium ion and/or quaternary ammonium ion may constitute all or part of the cation component other than the tin ion, lead ion and hydrogen ion in the bath.

The ammonium ion or cation component (G) is added to the plating bath as a salt having the cation as a base component. The anion that forms the salt with the cation may be selected from various acids such as organic sulfonic acids, perchloric acid, fluoroboric acid, phosphoric acid, pyrophosphoric acid, condensed phosphoric acids such as polyphosphoric acid, hydrochloric acid, hypophosphorous acid, and organic carboxylic acids. Preferably, this anion is selected from the same acid as acid (B) used in the plating bath. The cation-containing salts include ammonium borofluoride ammonium chloride, ammonium hypophosphite, tetramethylammonium hypophosphite, etc.

In either aspect, electroless plating of tin or a tin-lead alloy is carried out by immersing an article to be plated in the electroless plating bath. The article to be plated is preferably of copper or a copper alloy containing at least 50% by weight of copper such as brass and bronze. The article is maintained under sufficient conditions to form a tin or tin-lead alloy deposit on the article. The conditions include a temperature of 50° to 90° C., especially 60° to 80° C. and optional agitation.

The electroless plating bath and method according to the present invention are advantageously applicable to the plating of electronic parts such as printed wiring boards although the invention is also suitable for electroless plating of other articles of copper, copper alloy or the like.

EXAMPLE

Examples of the present invention are given below by way of illustration and not by way of limitation.

EXAMPLE 1

Five plating baths were prepared by adding the following additives (a) to (e) to plating solutions of the following compositions (1) to (5), respectively. Test printed wiring substrates having a copper circuit formed thereon were immersed in the plating baths at 70° C. for 6 minutes to deposit a tin or tin-lead alloy layer of 5 μm thick on the copper circuit. After the completion of plating, the deposited films were evaluated for solder availability. Also, the substrates were placed in a reflow apparatus where they were treated at 235° C. for 15 seconds. The reflow was evaluated by observing the appearance of the films. The results are shown in Table 1.

For comparison purposes, using plating solutions of compositions (1) to (5) as such without adding additives (a) to (e), tin or tin-lead alloy films were deposited on test printed wiring boards. The deposited films were evaluated for solder availability and reflow. The results are also shown in Table 1.

| Plating solution composition | |
|---|---|
| Plating solution (1) | |
| Methanesulfonic acid | 50 g/l |
| Stannous methanesulfonate | 20 g/l |
| Lead methanesulfonate | 13 g/l |
| Thiourea | 75 g/l |
| Sodium hypophosphite | 80 g/l |
| Citric acid | 15 g/l |
| EDTA | 3 g/l |
| pH | 2.0 |
| Plating solution (2) | |
| Stannous borofluoride | 20 g/l |
| Lead borofluoride | 50 g/l |
| Thiourea | 80 g/l |
| Pyrophosphoric acid | 200 g/l |
| Sodium hypophosphite | 50 g/l |
| pH | 0.8 |
| Plating solution (3) | |
| Stannous borofluoride | 20 g/l |
| Lead borofluoride | 10 g/l |
| Fluoroboric acid | 200 g/l |
| Thiourea | 50 g/l |
| Sodium hypophosphite | 30 g/l |
| pH | 0.8 |
| Plating solution (4) | |
| Methanesulfonic acid | 90 g/l |
| Stannous methanesulfonate | 20 g/l |
| Thiourea | 120 g/l |
| Sodium hypophosphite | 80 g/l |
| pH | 2.0 |
| Plating solution (5) | |
| Stannous borofluoride | 50 g/l |
| Fluoroboric acid | 200 g/l |
| Thiourea | 50 g/l |
| Sodium hypophosphite | 30 g/l |
| pH | 0.8 |
| Additive | |
| Additive (a) | |
| Polyoxynonylphenyl ether (EO 8 mol) | 5 g/l |
| 2-oxypyridine | 1 g/l |
| Additive (b) | |
| Polyoxylaurylphenyl ether | 10 g/l |
| Stearylamine hydrochloride | 5 g/l |
| Additive (c) | |
| Polyoxynonylphenyl ether (EO 8 mol) | 5 g/l |
| Polyoxystearylamide ether (EO 15 mol) | 5 g/l |
| 2-methyl-8-hydroxyquinoline | 3 g/l |
| Additive (d) | |
| Polyoxyethylene-polypropylene block polymer* | 8 g/l |
| Alkylpropylenediamine acetate (EO 20 mol) | 3 g/l |
| 2-oxyimidazole | 1 g/l |
| Additive (e) | |
| Polyoxynonylphenyl ether (EO 8 mol) | 5 g/l |
| Polyoxyoleylamine ether (EO 20 mol) | 3 g/l |
| Polyoxyethylene-polypropylene block polymer* | 8 g/l |

*EO 300%. PO having MW = 1300

TABLE 1

| Plating solution | Additive | Appearance of deposited film | Reflow | Solder availability |
|---|---|---|---|---|
| Examples | | | | |
| (1) | (a) | fine grains, uniform | ⊚ | ○ |
| (2) | (b) | fine grains, uniform | ⊚ | ⊚ |
| (3) | (c) | fine grains, uniform | ⊚ | ⊚ |
| (4) | (d) | fine grains, uniform | ⊚ | ⊚ |
| (5) | (e) | fine grains, uniform | ⊚ | ○ |
| Comparative Examples | | | | |
| (1) | — | coarse grains, non-uniform | Δ | X |
| (2) | — | coarse grains, non-uniform | X | X |
| (3) | — | coarse grains, non-uniform | Δ | Δ |
| (4) | — | coarse grains, non-uniform | Δ | X |
| (5) | — | coarse grains, non-uniform | Δ | X |

Evaluation standards
Reflow
⊚: excellent
○: good
Δ: somewhat poor
X: poor
Solder availability
⊚: film thickness of 20 μm or thicker
○: film thickness of 6 μm to less than 20 μm
Δ: film thickness of 3 μm to less than 6 μm
X: film thickness less than 3 μm As is evident from Table 1, the tin or tin-lead alloy electroless plating baths according to the present invention deposited uniform films comprised of fine grains. Printed wiring boards plated using the baths according to the present invention were sufficiently improved in reflow and other properties to accommodate for fine pitch SMT.

EXAMPLE II

Seven plating baths were prepared in accordance with the following compositions (6) to (12). The baths were allowed to stand for observing their change with time. The baths were evaluated for stability by determining the turbidity thereof. The results are shown in Table 2.

Thereafter, test printed wiring substrates having a copper circuit formed thereon were immersed in the plating baths at 70° C. for 6 minutes to deposit a tin or tin-lead alloy layer of 5 μm thick on the copper circuit. After the completion of plating, the deposited films were visually observed on appearance.

Also, the substrates were placed in a reflow apparatus where they were treated at 210° C. for 15 seconds. The reflow was evaluated by observing the appearance of the films. The results are shown in Table 2.

| Plating solution composition | |
|---|---|
| Plating solution (6) | |
| Methanesulfonic acid | 30 g/l |
| Stannous methanesulfonate | 20 g/l |
| Lead methanesulfonate | 13 g/l |
| Thiourea | 75 g/l |
| Ammonium hypophosphite | 80 g/l |
| Citric acid | 15 g/l |
| EDTA | 3 g/l |
| pH | 1.5 |

-continued

| Plating solution composition | |
|---|---|
| Plating solution (7) | |
| Ammonium methanesulfonate | 50 g/l |
| Stannous methanesulfonate | 20 g/l |
| Lead methanesulfonate | 13 g/l |
| Thiourea | 75 g/l |
| Ammonium hypophosphite | 70 g/l |
| Citric acid | 15 g/l |
| EDTA | 3 g/l |
| pH | 1.8 |
| Plating solution (8) | |
| Fluoroboric acid | 20 g/l |
| Stannous borofluoride | 20 g/l |
| Lead borofluoride | 50 g/l |
| Thiourea | 80 g/l |
| Ammonium pyrophosphate | 200 g/l |
| Tetramethylammonium hypophosphite | 50 g/l |
| pH | 1.0 |
| Plating solution (9) | |
| Ammonium chloride | 60 g/l |
| Stannous borofluoride | 20 g/l |
| Lead borofluoride | 50 g/l |
| Thiourea | 80 g/l |
| Methylamine pyrophosphate | 200 g/l |
| Hypophosphorous acid | 50 g/l |
| pH | 1.0 |
| Plating solution (10) | |
| Stannous chloride | 20 g/l |
| Lead acetate | 10 g/l |
| Hypophosphorous acid | 200 g/l |
| Thiourea | 50 g/l |
| Ammonium hypophosphite | 30 g/l |
| pH | 0.9 |
| Plating solution (11) | |
| Stannous borofluoride | 50 g/l |
| Fluoroboric acid | 200 g/l |
| Thiourea | 50 g/l |
| Tetramethylammonium hypophosphite | 30 g/l |
| pH | 0.8 |
| Plating solution (12) | |
| Methanesulfonic acid | 90 g/l |
| Stannous methanesulfonate | 20 g/l |
| Thiourea | 120 g/l |
| Hypophosphorous acid | 80 g/l |
| Tetramethylammonium hypophosphite | 40 g/l |
| pH | 1.1 |

For comparison purposes, three plating baths were prepared in accordance with the following compositions (13) to (15). Test printed wiring substrates having a copper circuit formed thereon were immersed in the plating baths at 70° C. for 6 minutes to deposit a tin or tin-lead alloy layer of 5 μm thick on the copper circuit. The substrates were placed in a reflow apparatus where they were treated at 235° C. for 15 seconds. The reflow was evaluated by observing the appearance of the films as in the Examples. Also, the stability of the baths and the appearance of the deposited films were evaluated as in the Examples. The results are shown in Table 2.

| Plating solution composition | |
|---|---|
| Plating solution (13) | |
| Methanesulfonic acid | 70 g/l |
| Stannous methanesulfonate | 20 g/l |
| Lead methanesulfonate | 13 g/l |
| Thiourea | 75 g/l |
| Sodium hypophosphite | 80 g/l |
| Citric acid | 15 g/l |
| EDTA | 3 g/l |
| pH | 2.0 |
| Plating solution (14) | |
| Fluoroboric acid | 20 g/l |
| Stannous borofluoride | 20 g/l |
| Lead borofluoride | 50 g/l |

-continued

| Plating solution composition | |
|---|---|
| Thiourea | 80 g/l |
| Pyrophosphoric acid | 200 g/l |
| Hypophosphorous acid | 50 g/l |
| Sodium hypophosphite | 50 g/l |
| pH | 0.5 |
| Plating solution (15) | |
| Fluoroboric acid | 20 g/l |
| Sodium borofluoride | 10 g/l |
| Stannous borofluoride | 20 g/l |
| Lead borofluoride | 50 g/l |
| Thiourea | 80 g/l |
| Pyrophosphoric acid | 200 g/l |
| Sodium hypophosphite | 50 g/l |
| pH | 0.9 |

TABLE 2

| Plating solution | Plating bath stability | Appearance of deposited film | Reflow |
|---|---|---|---|
| Examples | | | |
| (6) | ⊚ | fine grains, uniform | ⊚ |
| (7) | ⊚ | fine grains, uniform | ⊚ |
| (8) | ⊚ | fine grains, uniform | ⊚ |
| (9) | ⊙ | fine grains, uniform | ⊙ |
| (10) | ⊚ | fine grains, uniform | ⊚ |
| (11) | ⊚ | fine grains, uniform | ⊚ |
| (12) | ⊚ | fine grains, uniform | ⊚ |
| Comparative Examples | | | |
| (13) | X | coarse grains, non-uniform | X |
| (14) | X | coarse grains, non-uniform | Δ |
| (15) | X | coarse grains, non-uniform | X |

Ratings for bath stability and reflow
⊚: excellent
○: good
Δ: somewhat poor
X: poor As is evident from Table 2, the tin or tin-lead alloy electroless plating baths according to the present invention deposited uniform films comprised of fine grains. Printed wiring boards plated using the baths according to the present invention were sufficiently improved in reflow and other properties to accommodate for fine pitch SMT.

There has been described a tin or tin-lead alloy electroless plating bath and method which can deposit uniform films comprised of fine grains and sufficiently improved in reflow and solderavailability to accommodate for the plating of fine pitch printed wiring boards intended for SMT.

Although some preferred embodiments have been described, many modifications and variations may be made thereto in the light of the above teachings. It is therefore to be understood that within the scope of the appended claims, the invention may be practiced otherwise than as specifically described.

We claim:
1. A tin or tin-lead alloy electroless plating bath comprising

(A) a soluble metal salt component selected from the group consisting of a stannous salt and a mixture of a stannous salt and a lead salt,
(B) an acid,
(C) thiourea or a thiourea derivative,
(D) a hypophosphorous acid or a hypophosphite,
(E) a nonionic surfactant, and
(F) a member selected from the group consisting of a cationic surfactant, a heterocyclic compound having a nitrogen atom in the ring and a derivative thereof, and a mixture thereof.

2. A tin or tin-lead alloy electroless plating bath comprising
(A) a soluble metal salt component selected from the group consisting of a stannous salt and a mixture of a stannous salt and a lead salt,
(B) an acid,
(C) thiourea or a thiourea derivative, and
(D) an ammonium hypophosphite.

3. The tin or tin-lead alloy electroless plating bath according to claim 1 or 2, wherein the acid is selected from the group consisting of organic sulfonic acid, perchloric acid, fluoroboric acid, phosphoric acid, pyrophosphoric acid, condensed phosphoric acid, hydrochloric acid, hypophosphorous acid and organic carboxylic acid, and mixtures thereof.

4. The tin or tin-lead alloy electroless plating bath according to claim 1 or 2, wherein the acid is selected from the group consisting of methanesulfonic acid, ethanesulfonic acid, propanesulfonic acid, 2-propanesulfonic acid, butanesulfonic acid, 2-butanesulfonic acid, pentanesulfonic acid, chloropropanesulfonic acid, 2-hydroxyethane-1-sulfonic acid, 2-hydroxypropane-1-sulfonic acid, 2-hydroxybutane-1-sulfonic acid, 2-hydroxypentane-sulfonic acid, allylsulfonic acid, 2-sulfoacetic acid, 2- or 3-sulfopropionic acid, sulfosuccinic acid, sulfomaleic acid, sulfofumaric acid, benzenesulfonic acid, toluenesulfonic acid, xylenesulfonic acid, nitrobenzenesulfonic acid, sulfobenzoic acid, sulfosalicylic acid, benzaldehydesulfonic acid, and p-phenolsulfonic acid.

5. The tin or tin-lead alloy electroless plating bath according to claim 1, wherein the bath contains about 1 to 50 grams/liter of the stannous ion, 10 to 200 gram/liter of the acid, 10 to 200 gram/liter of thiourea, 0.01 to 50 gram/liter of the nonionic surfactant, and 0.01 to 50 gram/liter of the member selected from the group consisting of a cationic surfactant, a heterocyclic compound having a nitrogen atom in the ring and a derivative thereof, and a mixture thereof.

6. The tin or tin-lead alloy electroless plating bath according to claim 3, wherein the bath contains about 1 to 50 gram/liter of the stannous ion, 10 to 200 gram/liter of the acid, 10 to 200 gram/liter of thiourea, and 0.1 to 50 gram/liter of the ammonium hypophosphite.

7. The tin or tin-lead alloy electroless plating bath according to claim 5 or 6, wherein the bath is a tin-lead alloy electroless plating bath having about 0.1 to 50 gram/liter of the lead ion.

8. The tin or tin-lead alloy electroless plating bath according to claim 7, wherein the tin-lead alloy electroless plating bath contains about 0.5 to 10 gram/liter of the lead ion.

9. The tin or tin-lead alloy electroless plating bath according to claim 1, wherein the nonionic surfactant is selected from the group consisting of polyoxynonylphenyl ether, polyoxylaurylphenyl ether, polyoxystearylamide ether, polyoxyoleylamine ether and polyoxyethylene-propylene block polymer surfactant.

10. The tin or tin-lead alloy electroless plating bath according to claim 9, wherein a cationic surfactant is present in the bath and is selected from the group consisting of alkylamine salts, alkyltrimethylamine salts, and alkyldimethylbenzylamine salts.

11. The tin or tin-lead alloy electroless plating bath according to claim 9, wherein a heterocyclic compound having a nitrogen atom is selected from the group consisting of alkylpyridines, alkylimidazoles, alkylquinolines and alkylpurines.

12. A tin or tin-lead alloy electroless plating bath capable of forming uniform deposits of fine grains, including a soluble metal salt component in the form of a stannous salt or a mixture of a stannous salt and a lead salt, an acid, thiourea or a thiourea derivative, and a reducing agent, wherein the improvement comprises
the addition of one or more nonionic surfactant in combination with one or more nonionic surfactant in combination with one or more members selected from a cationic surfactant, a heterocyclic compound having a nitrogen atom in the ring and a derivative thereof, and a mixture thereof.

* * * * *